(12) United States Patent
Seacrist (10) Patent No.: US 8,080,482 B2
(45) Date of Patent: Dec. 20, 2011

(54) METHODS FOR PREPARING A SEMICONDUCTOR STRUCTURE FOR USE IN BACKSIDE ILLUMINATION APPLICATIONS

(75) Inventor: Michael R. Seacrist, Lake Saint Louis, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 310 days.

(21) Appl. No.: 12/454,512

(22) Filed: May 19, 2009

(65) Prior Publication Data

US 2009/0233428 A1    Sep. 17, 2009

Related U.S. Application Data

(62) Division of application No. 11/698,728, filed on Jan. 26, 2007.

(60) Provisional application No. 60/763,643, filed on Jan. 31, 2006.

(51) Int. Cl.
*H01L 21/31* (2006.01)

(52) U.S. Cl. .............. 438/766; 438/704; 438/E21.221

(58) Field of Classification Search .............. 257/607; 438/542, 549, 558
See application file for complete search history.

(56) References Cited

U.S. PATENT DOCUMENTS

| | | | |
|---|---|---|---|
| 4,104,090 A | 8/1978 | Pogge | |
| 4,628,591 A | 12/1986 | Zorinsky et al. | |
| 4,729,964 A | 3/1988 | Natsuaki et al. | |
| 5,023,200 A | 6/1991 | Blewer et al. | |
| 5,024,723 A | 6/1991 | Goesele et al. | |
| 5,032,540 A | 7/1991 | Follegot | |
| 5,462,883 A | 10/1995 | Dennard et al. | |
| 5,668,045 A | 9/1997 | Golland et al. | |
| 5,789,309 A | 8/1998 | Hellwig | |
| 5,880,010 A | 3/1999 | Davidson | |
| 6,635,950 B1 | 10/2003 | Ishida et al. | |
| 2006/0006488 A1 | 1/2006 | Kanbe | |
| 2006/0035448 A1 | 2/2006 | Krautbauer et al. | |

FOREIGN PATENT DOCUMENTS

| | | |
|---|---|---|
| EP | 0368768 A1 | 5/1990 |
| EP | 1148544 A1 | 10/2001 |
| WO | 98/42010 | 9/1998 |

OTHER PUBLICATIONS

Final Office Action for U.S. Appl. No. 11/698,728 mailed Jun. 11, 2010, 11 pages.
Asheghi et al., "Thermal Conduction in Doped Single-Crystal Silicon Films," Journal of Applied Physics, Apr. 15, 2002, pp. 5079-5088, vol. 91, No. 8, American Institute of Physics, US.
Campbell, "The Science and Engineering of Microelectronic Fabrication," (2nd edition) Mar. 2001, pp. 459-461, Oxford University Press, New York, US.

(Continued)

*Primary Examiner* — Marcos D. Pizarro
*Assistant Examiner* — Eva Yan Montalvo
(74) *Attorney, Agent, or Firm* — Armstrong Teasdale LLP (57) ABSTRACT

This invention generally relates to an epitaxial silicon semiconductor wafer with increased thermal conductivity to transfer heat away from a device layer, while also having resistance to common failure mechanisms, such as latch-up failures and radiation event failures. The semiconductor wafer comprises a lightly-doped device layer, a highly-doped protective layer, and a lightly-doped substrate. The invention is also directed to a process for forming such an epitaxial silicon wafer.

20 Claims, 10 Drawing Sheets
(4 of 10 Drawing Sheet(s) Filed in Color)

OTHER PUBLICATIONS

Capinski et al., "Thermal Conductivity of Isotopically Enriched Si," Applied Physics Letter, Oct. 13, 1997, pp. 2109-2111, vol. 71, No. 15, American Institute of Physics, US.

Fairchild Semiconductor, "AN-600 Understanding Latch-Up in Advanced CMOS Logic," Revised Apr. 1999, pp. 1-4, Fairchild Semiconductor Corporation, US.

Gurrum et al., "Thermal Issues in Next-Generation Integrated Circuits," IEEE Transactions on Device and Materials Reliability, Dec. 2004, pp. 709-714, vol. 4, No. 4, US.

Komarov et al., "Transient Thermo-Reflectance Measurements of the Thermal Conductivity and Interface Resistance of Metallized Natural and Isotopically-Pure Silicon," Microelectronics Journal, Dec. 2003, pp. 1115-1118, vol. 34, No. 12, Elsevier, US.

Viswanath et al., "Thermal Performance Challenges from Silicon to Systems," Intel Technology Journal, 2000, pp. 1-16, vol. Q3, US.

Wolf et al., "Silicon Processing for the VLSI Era, vol. 1: Process Technology," 1986, pp. 385-387, Lattice Press, Sunset Beach, CA.

Xu et al., "Extension of Air Cooling for High Power Processors," Jun. 1-4, 2004, ITHERM 2004, 9th Intersociety Conference on Thermal and Thermomechanical Phenomena in Electronic Systems, pp. 186-193, US.

International Search Report and Written Opinion for analogous application No. PCT/US2007/061128, dated Jul. 3, 2007.

Co-owned Divisional U.S. Appl. No. 11/698,728, filed Jan. 26, 2007.

Quirk et al., "Semiconductor Manufacturing Technology," Prentice-Hall, New Jersey, (2001), p. 35.

Office Action in co-owned U.S. Appl. No. 11/698,728, dated Oct. 7, 2009.

METHODS FOR PREPARING A SEMICONDUCTOR STRUCTURE FOR USE IN BACKSIDE ILLUMINATION APPLICATIONS

CROSS-REFERENCE TO RELATED APPLICATIONS

This application is a divisional of U.S. application Ser. No. 11/698,728, filed Jan. 26, 2007, which claims the benefit of U.S. Provisional Application No. 60/763,643, filed Jan. 31, 2006, the entire disclosures of which are incorporated herein by reference.

THE FIELD OF THE INVENTION

The present invention generally relates to a semiconductor wafer and a process for making the same. More particularly, the present invention relates to a semiconductor wafer having improved thermal conductivity characteristics, offering advantages when used as a substrate for a high-speed processor device.

BACKGROUND OF THE INVENTION

Within the semiconductor industry, the overall scaling trend has been to increase the silicon power density by increasing transistor density and operating frequency on processor devices. However, the power reductions gained from design and process modifications are not sufficient to offset the higher operating temperatures accompanying the increased power density. In turn, the semiconductor's electrical performance and reliability is significantly degraded at higher operating temperature, reducing the semiconductor's processor speed and lifespan. As such, it is increasingly important to lower the semiconductor junction temperatures across the structure, particularly avoiding local hot spots in areas that run at higher power density.

Currently, the majority of high performance processor devices are fabricated on a thin (about 2-4 µm), lightly-doped (about $1 \times 10^{15}$-$1 \times 10^{16}$ carriers/cm$^3$) epitaxial silicon layer grown over a heavily-doped (about $10^{19}$ carriers/cm$^3$) silicon substrate wafer, wherein boron is a preferred dopant. This type of wafer is generally referred to as a P/P++ epitaxial wafer or P/P+ epitaxial wafer. Epitaxial silicon layers such as these are typically grown by a chemical vapor deposition process wherein a substrate is heated while a gaseous silicon compound is passed over the wafer surface to affect pyrolysis or decomposition.

The heavily-doped silicon substrate below the device layer is intended to provide protection against many common device failure mechanisms, such as device latch-up failures, failures related to diffusion leakage current, or some radiation event-related failures. For example, latch-up failure refers to an electron-collection phenomenon resulting in a dead short circuit at a parasitic junction, but which can be prevented using, inter alia, strategic doping designs. Therefore, the arrangement of a lightly-doped device layer on a heavily-doped silicon substrate provides desirable latch-up and low diffusion current characteristics.

One disadvantage to using a heavily-doped silicon substrate is its poor thermal conductivity, as compared to the lightly-doped device layer; the thermal conductivity of lightly-doped silicon has been reported to be about 20% greater than heavily-doped silicon, and possibly even higher. See, e.g., P. Komarov et al., *Transient Thermo-Reflectance Measurements of the Thermal Conductivity and Interface Resistance of Metallized Natural and Isotopically-Pure Silicon*, 34 Microelectronics Journal No. 12, at 1115-1118 (2003). The difference in thermal conductivity is significant because the majority of heat generated in the thin device layer is transferred to the ambient environment by dissipation through the silicon substrate, and lesser thermal conductivity tends to reduce efficiency and reliability.

To improve heat removal from the device layer, efforts have previously focused on improving the thermal transfer characteristics from the back of the silicon substrate, through the packaging, and to the environment during use. While design of the packaging material and heat sinks have reduced the thermal resistance at this interface to maintain lower die temperatures, such efforts do not address the problem of localized heating at hot spots in the device layer.

Backside autodoping, i.e., the migration of dopant atoms from the back or sides of the substrate into the device layer, is another problem commonly encountered when a heavily doped substrate is integrated with a lightly doped device layer. One conventional approach to limit this effect is to form a backside oxide seal on the highly doped substrate. However, the oxide seal can not be integrated into the epitaxial silicon structure in the case of double-side polished wafers.

Heavily doped substrates having a lightly doped epitaxial layer also present challenges when used in CMOS Image Sensor applications wherein backside illumination technology is desirable. Currently, commercially available image sensors are illuminated from the device side. For typical device-side illumination applications, a CMOS Image Sensor silicon wafer comprises a substrate that is doped to a P+ or P++ concentration and an epitaxial layer doped to a P concentration. The known use of device-side illumination cannot meet the scaling trends and goals in such applications, which include reducing pixel size and increasing circuit functionality via advanced metal interconnections. Backside illumination is believed to realize these goals, while also improving the device's fill factor and quantum efficiency. These terms are used as different ways to measure the net amount of light energy that is actually able to illuminate the image sensors. Fill factor, which refers to the percentage or fraction of the image sensor that is capable of being exposed to light, is reduced in traditional device-side illumination devices by increasingly complex metallization layers and films, as well as advanced device topography. As the fill factor decreases, so does the quantum efficiency, which measures how efficiency projected light is able to generate active electron carriers.

These desired improvements in image sensor performance are possible using backside illumination technology because device-side features such as device patterns, metallization layers, interconnects, and films do not impede the illumination process. The result is nearly 100% fill factor, improved flexibility in antireflection coatings, and increased quantum efficiency. Moreover, backside illumination allows for integration of advanced device architecture and interconnections. However, backside illumination must be performed within a few microns of the device side photodiode to efficiently convert visible light to electrical signals. This requires consistent and uniform material removal from the backside of the original, as-formed silicon structure to create a smooth backside surface, which requires thinning the silicon structure from several hundred microns to just a few microns, such as less than about 15 µm. Furthermore, the backside surface must be capable of being passivated against recombination of photon-generated carriers at the surface, while also directing these photon-generated carriers to a collecting photodiode with an electric field within the Image Sensor device. Such features are not readily ascertained using conventional mechanical or chemical means to thin the silicon structure. Mechanical means of thinning may not be feasible with such small dimensions, while controlling chemical removal rates is difficult within the tolerances of the image sensor's physical features.

SUMMARY OF THE INVENTION

Among the various aspects of the present invention is a silicon semiconductor wafer with favorable heat transfer characteristics while providing resistance to common semiconductor failure mechanisms.

Briefly, therefore, the present invention is directed to a semiconductor wafer comprising a silicon device layer, a substrate, and a silicon protective layer disposed between the device layer and the substrate. The substrate has a central axis, a front surface, and a back surface that are generally perpendicular to the central axis, a circumferential edge, and a radius extending from the central axis to the circumferential edge. The protective layer has a thickness of at least about 0.5 µm and is doped, the concentration of the dopant in the protective layer being between about $6.0 \times 10^{17}$ carriers/cm$^3$ and about $1.0 \times 10^{20}$ carriers/cm$^3$. The substrate and the device layer are also doped with the concentration of dopant in the substrate and device layer being less than about $1 \times 10^{17}$ carriers/cm$^3$.

The present invention is further directed to a process for the preparation of this semiconductor wafer.

Other objects and features will be in part apparent and in part pointed out hereinafter.

BRIEF DESCRIPTION OF THE DRAWINGS

Corresponding reference characters indicate corresponding parts throughout the drawings.

The patent or application file contains at least one drawing executed in color. Copies of this patent or patent application publication with color drawing(s) will be provided by the U.S. Patent and Trademark Office upon request and payment of the necessary fee.

DETAILED DESCRIPTION OF THE INVENTION

Figure 1:
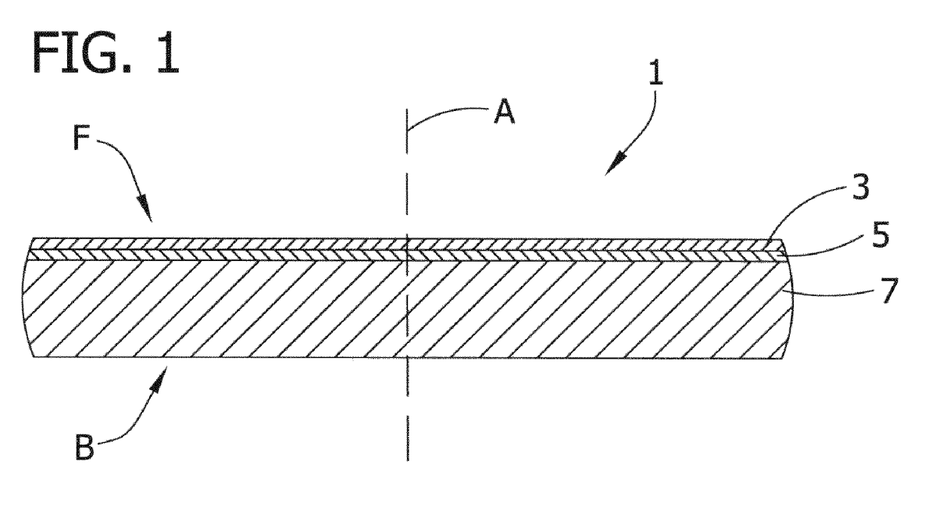
FIG. 1 is a schematic cross-section of a semiconductor wafer of the invention.

Referring now to FIG. 1, among the various aspects of the present invention is a semiconductor wafer 1 with improved thermal conductivity. Semiconductor wafer 1 has a front surface F, a back surface B, and an imaginary central axis A, with the terms "front" and "back" being used in this context merely to distinguish the two major, generally planar surfaces of the wafer. Semiconductor wafer 1 also comprises silicon device layer 3, silicon protective layer 5, and substrate 7.

To inhibit various commonly known device failure mechanisms, the thermal conductivity of substrate 7 is preferably at least 5% greater than the thermal conductivity of protective layer 5 (at temperatures not in excess of 125° C.). More preferably, the thermal conductivity of substrate 7 is at least 10% greater than the thermal conductivity of protective layer 5 (at temperatures not in excess of 125° C.). For example, in some embodiments, the thermal conductivity of substrate 7 will be at least 15% greater, at least 20% greater, or even at least 25% greater than the thermal conductivity of protective layer 5 at temperatures not in excess of 125° C.

Figure 2:
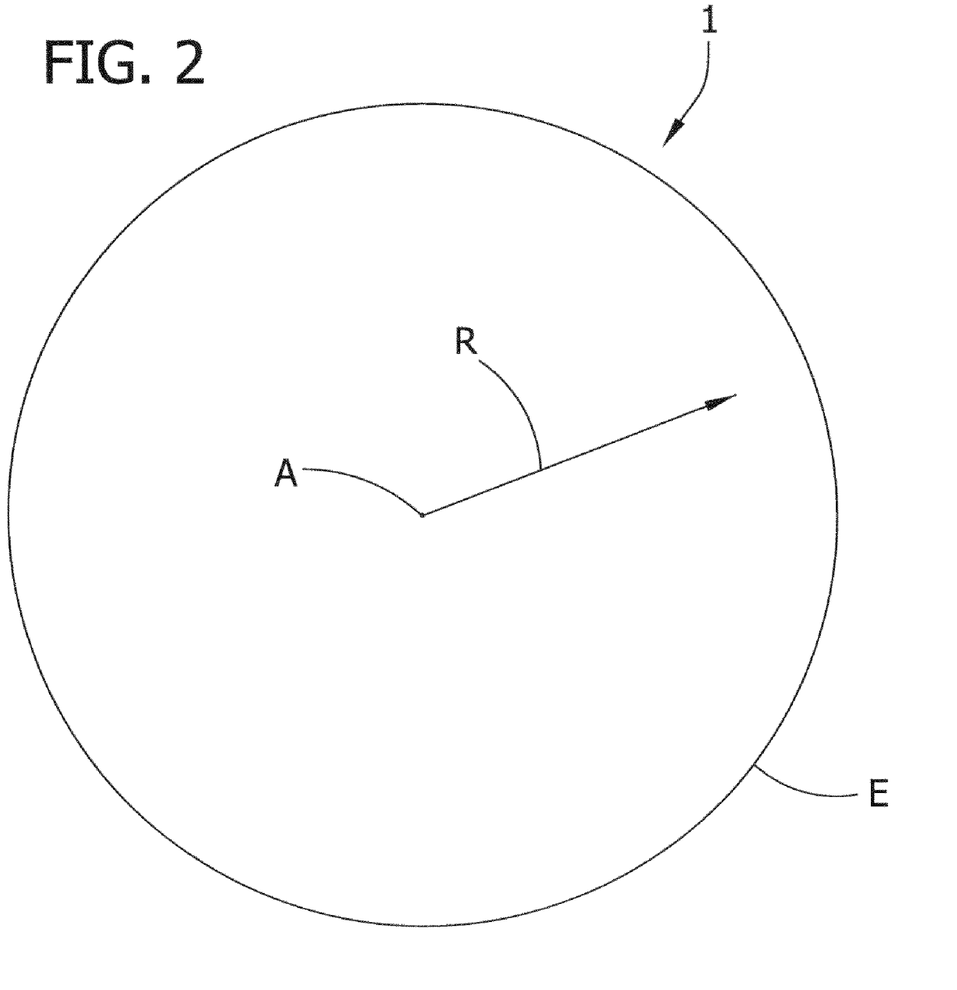
FIG. 2 is a schematic top-down view of a semiconductor wafer of the invention, wherein the axis in FIG. 2 is coincident with the axis in FIG. 1.

Referring now to FIG. 2, semiconductor wafer 1 has an imaginary radius, R, extending from axis A, to edge E of semiconductor wafer 1. Because the semiconductor wafers of the present invention are used as a starting material in device fabrication processes, it is generally preferred that device layer 3 and silicon protective layer 5 extend substantially across the diameter of the wafer. That is, it is generally preferred that device layer 3 and silicon protective layer 5 incorporate and are symmetrically disposed about axis A and extend at least 90% of the length of radius R from the axis to semiconductor wafer edge E. More preferably, device layer 3 and silicon protective layer 5 incorporate and are symmetrically disposed about axis A and extend at least 99% of the length of radius R from the axis to semiconductor wafer edge E.

Figure 3:
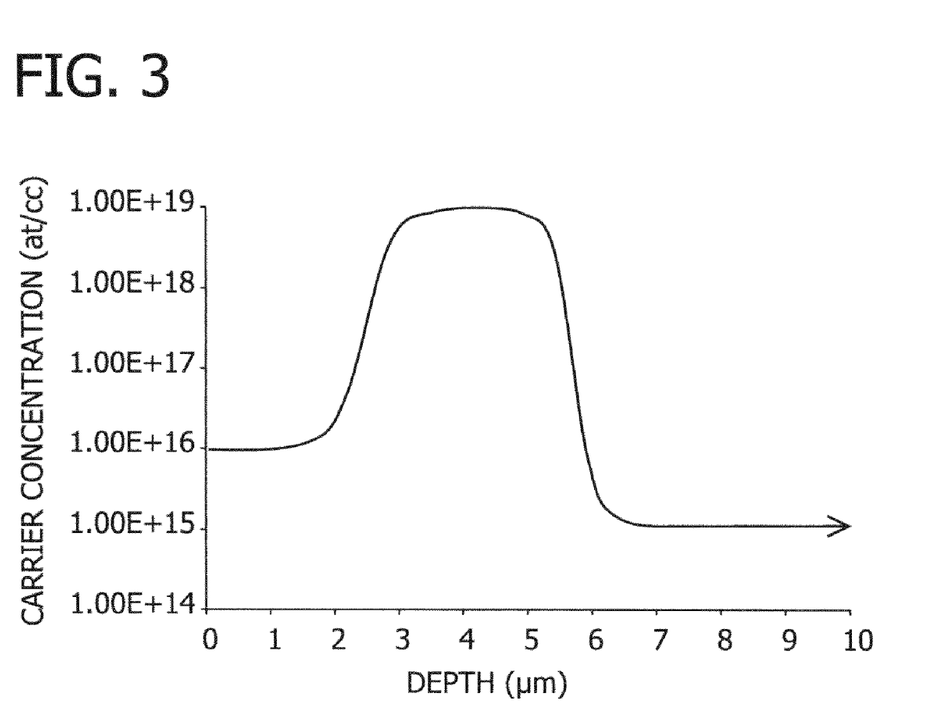
FIG. 3 is a graphical representation of the carrier concentration profile for a semiconductor wafer having a highly doped protective layer and a lightly doped substrate.

Referring now to FIG. 3, a carrier concentration profile for an exemplary semiconductor wafer of the present invention is illustrated. As depicted, the device layer of the semiconductor wafer (the region of the wafer from a depth of 0 to about 2 µm) has a dopant concentration of about $1 \times 10^{16}$ atoms/cm$^3$, the silicon protective layer (the region of the wafer from a depth of about 3 to about 5 µm) has a dopant concentration of $1 \times 10^{19}$ atoms/cm$^3$, and the substrate (the region of the wafer at depths greater than about 6 µm) has a dopant concentration of about $1 \times 10^{15}$ atoms/cm$^3$. In accord with the invention, either P-type or N-type dopants may be employed to dope each of the device layer 32, the protective layer 33, and the substrate 34, when semiconductor materials are selected for the substrate.

I. The Substrate

In general, the substrate comprises a material on which additional layers may be formed and which typically has a thermal conductivity of at least about 120 W/m·K. The substrate may comprise a single stratum of material, or it may comprise multiple strata. Typically, however, the substrate is sliced from a single crystal silicon ingot grown according to one of the known techniques, such as the Czochralski ("Cz") or float zone methods. Accordingly, for the purposes of illustration, reference to a single crystal silicon wafer will be utilized hererin. Therefore, in one application, the starting material for the wafer of the present invention is a silicon substrate that has been sliced from a single crystal ingot grown in accordance with Cz crystal growing methods, typically having a nominal diameter of 150 mm, 200 mm, 300 mm, or more. The substrate may be polished or, alternatively, lapped and etched but not polished. Such methods, as well as standard silicon slicing techniques, are disclosed in, e.g., FUMIO SHIMURA, SEMICONDUCTOR SILICON CRYSTAL TECHNOLOGY (1989) and SILICON CHEMICAL ETCHING (Josef Grabmaier ed., 1982). Preferably, the substrates are polished and cleaned by standard methods known to those skilled in the art. See, e.g., HANDBOOK OF SEMICONDUCTOR SILICON TECHNOLOGY (William C. O'Mara et al. eds., 1990).

In general, the single crystal silicon substrate is lightly doped such that it is P− or N− silicon, as those designations are conventionally used in the art and described herein. That is, for P-type doping applications, the silicon substrate generally has less than about $1 \times 10^{16}$ carriers/cm$^3$, such as less than about $5 \times 10^{15}$ carriers/cm$^3$. Furthermore, the substrate typically contains at least about $5 \times 10^{14}$ carriers/cm$^3$ to minimize undesirable phenomena observed at lower doping levels, such as oxygen-related thermal donor generation. For example, the P-doped single crystal silicon substrate typically has between about $5 \times 10^{14}$ carriers/cm$^3$ and about $1 \times 10^{16}$ carriers/cm$^3$. For N-type doping applications, the silicon substrate generally has less than about $5 \times 10^{15}$ carriers/cm$^3$, such as less than about $1 \times 10^{15}$ carriers/cm$^3$.

In another aspect, the silicon substrate has thermal conductivity of at least about 5% greater than the thermal conductivity of P++ or N++ silicon, as those terms are conventionally used in the art and described herein. In general, doped silicon's thermal conductivity is inversely related to the doping level and the atmospheric temperature; i.e., doped silicon's thermal conductivity decreases as the concentration of dopant and atmospheric temperature increase. Data collected to date suggests that at room temperature, P++ or N++ silicon exhibits a thermal conductivity of less than about 114 W/m·K. Therefore, the thermal conductivity of the silicon substrate is greater than about 120 W/m·K. More typically, the silicon substrate's thermal conductivity is greater than about 130 W/m·K, such as greater than about 135 W/m·K. In some applications, the thermal conductivity will be greater than about 140 W/m·K, or even greater than about 150 W/m·K.

The single crystal silicon substrate contains at least one dopant to give the substrate various desirable properties. For example, the substrate may comprise P-type dopants (i.e., elements from Group 3 of the Periodic Table, e.g., boron, aluminum, gallium and indium) or N-type dopants (i.e., elements from Group 5 of the Periodic Table, e.g., phosphorus, arsenic, antimony). When P-type doping is desired, the dopant is preferably boron. When N-type doping is desired, the dopant is preferably phosphorus.

II. Protective Layer

The protective layer typically comprises highly-doped silicon to provide protection against common device failure mechanisms, such as latch-up and low diffusion current failures. Depending on the application, any one of the appropriate P-type or N-type dopants noted above may be used to form the protective layer. Generally, the protective layer typically comprises greater than about $1 \times 10^{18}$ carriers/cm$^3$. For example, for P-type doping applications, the highly-doped silicon protective layer comprises between about $1 \times 10^{18}$ carriers/cm$^3$ and about $1 \times 10^{20}$ carriers/cm$^3$. Common ranges include between about $8.5 \times 10^{18}$ carriers/cm$^3$ and about $2.0 \times 10^{19}$ carriers/cm$^3$ when the dopant concentration is characterized as P++, and between about $3.2 \times 10^{18}$ carriers/cm$^3$ and about $8.5 \times 10^{18}$ carriers/cm$^3$ when the dopant concentration is characterized as P+. In one preferred embodiment, the protective layer's dopant concentration is between about $1.0 \times 10^{19}$ carriers/cm$^3$ and about $1.25 \times 10^{19}$ carriers/cm$^3$. For N-type doping applications, the highly-doped silicon protective layer comprises between about $6.0 \times 10^{17}$ carriers/cm$^3$ and about $5 \times 10^{19}$ carriers/cm$^3$. Common ranges include between about $1.2 \times 10^{19}$ carriers/cm$^3$ and about $3.5 \times 10^{19}$ carriers/cm$^3$ when the dopant concentration is characterized as N++, and between about $6.0 \times 10^{17}$ carriers/cm$^3$ and about $4.5 \times 10^{18}$ carriers/cm$^3$ when the dopant concentration is characterized as N+.

In another aspect, the protective layer is characterized by a thermal conductivity lower than the substrate's thermal conductivity. That is, the protective layer is characterized by thermal conductivity of less than about 114 W/m·K at room temperature. For example, the protective layer is characterized by thermal conductivity of less than about 110 W/m·K, or even less than about 100 W/m·K at room temperature.

In light of the substrate's thermal conductivity noted above, the substrate has a thermal conductivity of greater than about 120 W/m·K protective layer and the protective layer has a thermal conductivity of less than about 114 W/m·K. For example, in one application, the substrate's thermal conductivity is greater than 130 W/m·K and the protective layer's thermal conductivity is less than about 114 W/m·K. In another application, the substrate's thermal conductivity is greater than 135 W/m·K and the protective layer's thermal conductivity is less than about 110 W/m·K.

The resistivity of the protective layer is an alternative way by which the carrier concentration can be estimated. The resistivity of the protective layer is generally between about 2.5 mΩ·cm and about 25 mΩ·cm, with common ranges being between about 5 mΩ·cm and about 10 mΩ·cm and between about 10 mΩ·cm and about 20 mΩ·cm. In one preferred embodiment, the protective layer's resistivity is about 8 mΩ·cm.

In general, the protective layer is thick enough to provide the desired protection, yet as thin as possible to promote heat transfer from the device layer to the high thermal conductivity substrate. Typically, the protective layer is at least about 1 μm thick, such as between about 1 μm and about 10 μm thick. More typically, the protective layer will be between about 1 μm and about 5 μm thick; and for some applications, the protective layer will be between about 1 μm and about 3 μm thick.

Any known technique for forming a heavily-doped silicon protective layer on a silicon substrate may be used to form the protective layer. For example, the protective layer may be formed by using epitaxial deposition, ion implantation, and gas phase doping plus high temperature diffusion. Each of these techniques are well-known and are detailed further in literature references readily available to one skilled in the art, such as STANLEY WOLF & R. N. TAUBER, SILICON PROCESSING FOR THE VLSI ERA—PROCESS TECHNOLOGY (1st ed. 1986) and STEPHEN A. CAMPBELL, THE SCIENCE AND ENGINEERING OF MICROELECTRONIC FABRICATION (2nd ed. 2001).

An epitaxial layer may be deposited or grown on a surface of the above-described substrate by means generally known in the art, such as the epitaxial growth process described in U.S. Pat. No. 5,789,309. Typically, growth of the epitaxial layer is achieved by chemical vapor deposition, because this is one of the most flexible and cost effective methods for growing epitaxial layers on semiconductor material. One advantage to forming the protective layer by epitaxial deposition is that existing epitaxial growth reactors can be used in conjunction with a direct dopant feed during epitaxial growth. For example, when doping the silicon with boron, a high concentration diborane source gas can be mixed with the carrier gas used to dope the epitaxially grown protective layer.

In another embodiment, ion implantation techniques are used to force dopant atoms into the single crystal silicon substrate. In yet another embodiment, gas phase doping techniques are used to force the dopant atoms into the single crystal silicon substrate. When either an ion implantation or a gas phase doping technique is used, the technique is carried out at an elevated temperature or is followed by a high temperature anneal to diffuse the dopant atoms into the substrate to form the protective layer.

Regardless of the specific technique used to form the highly-doped silicon protective layer, the dopant profile created by the transition between the highly-doped protective layer to the lightly-doped substrate also creates an electric field that directs excess charge carriers away from this interface into the substrate. By creating an electric field that moves charge carriers away from the protective layer, and therefore away from the device layer, the protective layer also effectively reduces the impact of radiation-induced events or failures.

III. Device Layer

In general, the device layer is sufficiently thick enough to comprise at least one level of electrical devices. The device layer may comprise more than one level of electrical devices; thus, the thickness will vary depending on the number of levels required for a particular application. The device layer is generally less than about 25 µm thick. For example, the device layer will typically be between about 1 µm and about 25 µm thick. For some applications, the device layer will be between about 1 µm and about 20 µm thick. In other applications, the device layer will be between about 1 µm and about 10 µm thick. In yet other applications, the device layer will be between about 1 µm and about 5 µm thick, such as, e.g., in high speed microprocessor device. Alternatively, for some applications such as, e.g., power devices, the device layer will be between about 5 µm and about 20 µm.

To create the device layer, the semiconductor wafer may undergo any suitable epitaxial deposition technique, as described above. The growth is carried out for a time sufficient to form a device layer of desired thickness in an epitaxial growth reactor. The device layer may be doped after the epitaxial layer is grown or in conjunction with its growth. A direct dopant feed may be employed when the device layer is doped during growth; e.g., a diborane source gas can be used when doping the silicon with boron. The dopant level is in accord with conventional silicon device layers, such that it is typically referred to as being P, P−, N, or N−. That is, the device layer typically comprises between about $7.5 \times 10^{14}$ carriers/cm$^3$ and about $2.5 \times 10^{16}$ carriers/cm$^3$. For example, the device layer typically comprises between about $1 \times 10^{15}$ carriers/cm$^3$ and about $1 \times 10^{16}$ carriers/cm$^3$. Depending on the application, any one of the appropriate P-type (e.g., boron) or N-type dopants (e.g., phosphorus) noted above may be used. Typical applications for a device layer doped with P-type dopants include, e.g., high speed microprocessor devices such as, e.g., memory and logic applications. Typical applications for a device layer doped with N-type dopants include, e.g., power devices.

IV. Resulting Wafer Characteristics and Applications

A. Backside Autodoping Prevention

In one embodiment, the present invention is utilized to form a P/P+/P− semiconductor structure; i.e., the invention can be used to form a lightly doped P− substrate with a highly doped P+ protective layer and an intermediately doped P device layer. Such a semiconductor structure may be used in applications where backside autodoping is to be avoided, such as, e.g., heavily doped substrates with a lightly doped device layer where an oxide seal is undesirable, as with structures with a double sided polish. By forming a P/P+/P− semiconductor structure according to the present invention, the functional equivalent of the P to P+ transition from the device layer to the protective layer is realized, with the added benefit of avoiding the migration of dopant atoms from the backside of the structure to the device layer because of the substrate's lower doping level. In this application, the substrate has a dopant level below about $1 \times 10^{16}$ carriers/cm$^3$, the protective P+ layer has a dopant level of between about $3.2 \times 10^{18}$ carriers/cm$^3$ and about $8.5 \times 10^{18}$ carriers/cm$^3$, and the device layer has a dopant level of between about $1 \times 10^{14}$ carriers/cm$^3$ and about $4 \times 10^{16}$ carriers/cm$^3$. The protective layer may also be a P++ layer having between about $8.5 \times 10^{18}$ carriers/cm$^3$ and about $2.0 \times 10^{19}$ carriers/cm$^3$. Furthermore, the protective P+ layer is typically between about 1 µm and about 10 µm thick, while the device layer is typically between about 2 µm and about 5 µm thick.

B. Backside Illumination Applications

Figure 10:
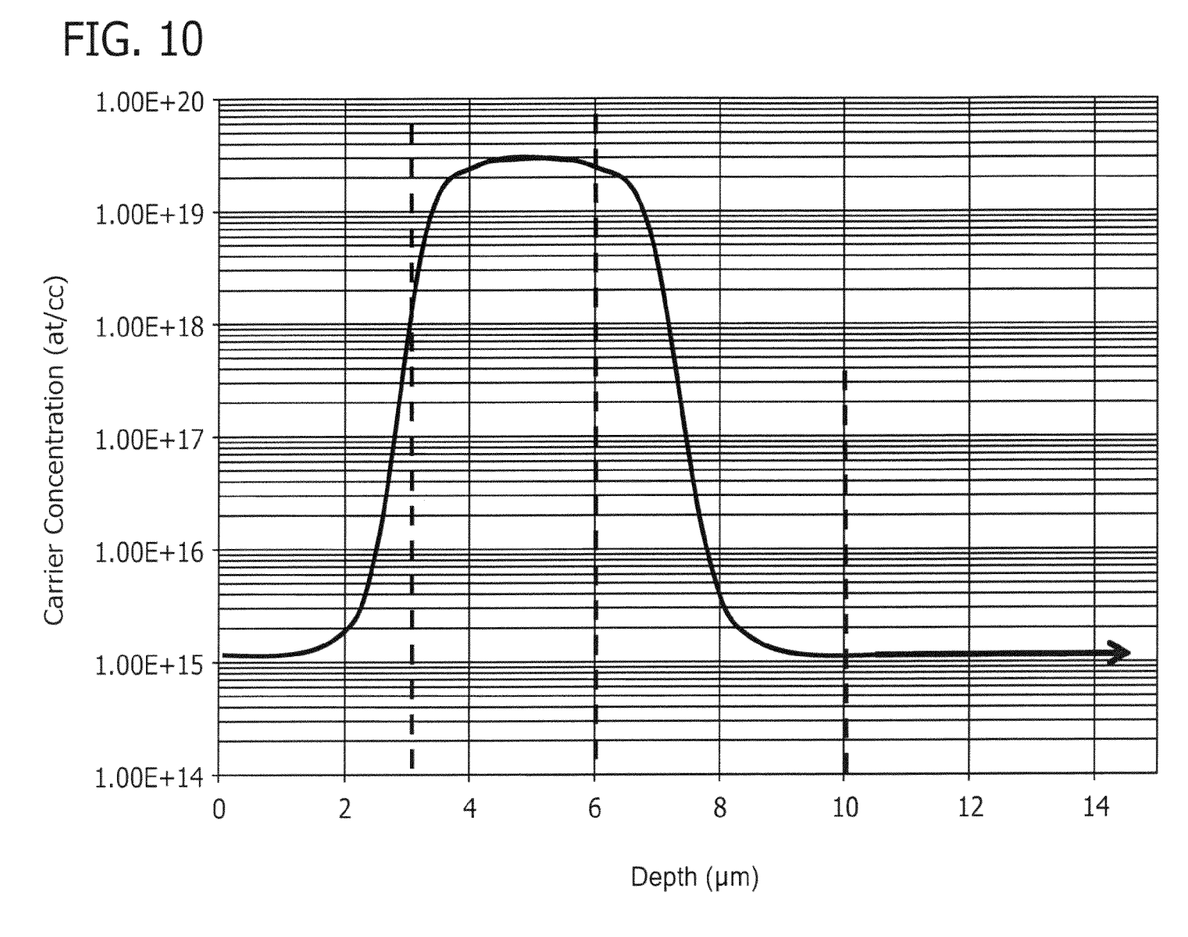
FIG. 10 is a graphical representation of the carrier concentration profile for a semiconductor wafer for an image sensor application.

Additionally, a P/P++/P− semiconductor structure formed according to the present invention is useful in the production of thin silicon structures for use in backside illumination applications, such as, e.g., improved CMOS Image Sensor devices. FIG. 3 shows a typical carrier concentration profile for a typical P/P++/P− semiconductor structure in this application. After a P/P++/P− semiconductor structure is formed, the back surface of the P− substrate is exposed to an alkaline etchant for a time period sufficient to remove substantially all of the substrate material and yield a uniformly thinned P/P++ silicon structure with a highly uniform thickness. That is, in this application of the present invention, the highly doped P++ (or even P+++) protective layer acts as an etch stop for alkaline etchants. Typical etchants comprise compounds such as, e.g., tetramethylammonium hydroxide (TMAH), potassium hydroxide (KOH), and sodium hydroxide (NaOH), in appropriate concentrations. In one preferred application, TMAH is used in the alkaline etchant, with about 25 wt % being one preferred concentration of TMAH. The highly doped protective layer acts as an etch stop using alkaline etchants because the P− substrate is etched at an etching rate of about 10× to about 20× faster than the P++ protective layer. For example, FIG. 10 graphically shows how the alkaline etchant may be used to remove material to at least the dashed vertical line shown at about 10 µm, and possibly to remove material to the dashed vertical line shown at about 6 µm. The etching performed for this application may optionally occur in an electrochemical cell, which would increase the etching rate and facilitate an optional electrochemical passivation step after etching.

Optionally, mechanical means, e.g., grinding or polishing, are employed to remove a substantial portion of the back surface of the P− substrate before exposing the remaining back surface of the P− substrate to the alkaline chemical etchant. In this case, mechanical means are employed to remove more than about 75% of the P− substrate's thickness, such as more than about 80%, 90%, or even more than about 95% of the substrate's thickness before employing the alkaline etchant. For example, referring again to FIG. 10, mechanical means may be used to remove material to at least the dashed vertical line shown at about 10 µm, and the alkaline etchant may be subsequently used to remove additional material to the dashed vertical line shown at about 6 µm. Further, the P++ surface exposed by the substrate's removal is optionally exposed to an acidic etchant to further thin the P/P++ silicon structure and further smooth the P++ surface. In one application, e.g., the acidic etchant comprises a solution of hydrofluoric, nitric, and acetic acids (HNA). Referring again to FIG. 10, the acidic etchant may be used to remove material from the dashed vertical line shown at about 6 μm to the dashed vertical line shown at about 3 μm.

In this application, the substrate has a dopant level below about $1\times10^{16}$ carriers/cm$^3$, the protective layer has a dopant level of greater than about $1.0\times10^{19}$ carriers/cm$^3$, such as between about $1.0\times10^{19}$ carriers/cm$^3$ and about $1.0\times10^{20}$ carriers/cm$^3$. For example, the protective layer may have between about $5.0\times10^{19}$ carriers/cm$^3$ and about $1.0\times10^{20}$ carriers/cm$^3$. Silicon doped with such concentrations are commonly referred to as highly doped P++ or even P+++ silicon layers. Furthermore, the thickness of the protective layer is limited in this application, with higher doping concentrations corresponding to thinner protective layers. For example, the protective layer acting as the etch stop is typically less than about 5 μm thick, such as less than 2 μm, less than about 1 μm thick, or even less than about 0.5 μm thick. In one application, the protective layer further comprises Ge to act as a crystal lattice strain reliever, which permits the highly doped protective layer to have greater thicknesses than reported above. Finally, the device layer is typically between about 2 μm and about 15 μm thick, such as between about 2 μm and about 10 μm thick. In one application, the device layer is between about 2 μm and about 5 μm thick.

The resulting P/P++ silicon structure's backside P++ surface is smooth, which minimizes light scattering during backside illumination. Also, the doping gradient formed by the transition from device layer to the protective layer creates an electric field that promotes electron migration away from the backside illuminated surface and toward the device layer, which is advantageous in image sensor devices as quantum efficiency is increased at photodiode junctions.

Having described the invention in detail, it will be apparent that modifications and variations are possible without departing from the scope of the invention defined in the appended claims.

EXAMPLES

The following non-limiting examples are provided to further illustrate the present invention.

Example 1

Two types of semiconductor wafers were prepared, the first type having a P− substrate, representing an exemplary semiconductor wafer of the present invention, and the second type having a P++ substrate, representing a semiconductor wafer known in the art. P-type dopants were used for each type of semiconductor wafer. The semiconductor wafers having P− substrates had a carrier concentration profile wherein a device layer having a concentration of about $1\times10^{16}$ carriers/cm$^3$ extended approximately 2 μm into the wafer, a protective layer having a concentration of about $1\times10^{19}$ carriers/cm$^3$ extended from a depth of about 3 to about 5 μm into the wafer, and a substrate having a concentration of about $1\times10^{15}$ carriers/cm$^3$ extended from about 6 μm through the depth of the wafer. The semiconductor wafers having P++ substrates had a carrier concentration profile wherein a device layer having a concentration of about $1\times10^{16}$ carriers/cm$^3$ extended approximately 2 μm into the wafer and substrate having a concentration of about $1\times10^{19}$ carriers/cm$^3$ extended from about 3 μm through the depth of the wafer. The doping profiles for each respective type of semiconductor wafer are shown in FIGS. 3 and 4.

Figure 4:
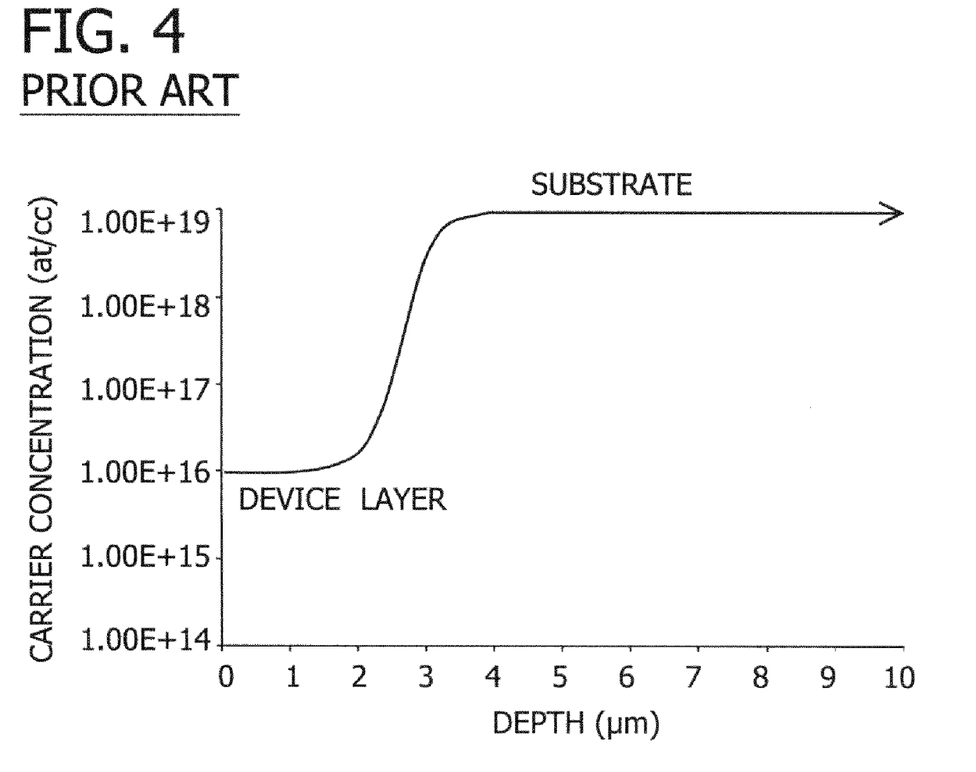
FIG. 4 is a graphical representation of the carrier concentration profile for a semiconductor wafer having a lightly doped device layer and a highly doped substrate detailed in Example 1.

Notably, FIGS. 3 and 4 show that the carrier dopant profile associated with each type of semiconductor wafer is the same to a depth of about 4 μm, i.e., both types of wafer share a P/P++ transition at about 2 to 3 μm from the wafers' front surface. Such a transition confirms that device failure protection will be present in the semiconductor wafers exemplary of the present invention at the device/protective layer interface. Also, the doping gradient at the interface between the heavily-doped protective layer and the lightly-doped substrate creates an electrical field that further reduces the collection of charge carriers generated in the substrate below the device layer, thereby improving the protective function of the protective layer in the semiconductor wafers exemplary of the present invention.

Thermal modeling was then performed on wafers depicted in FIGS. 3 and 4 under two conditions: uniform heating and localized hot spots. The simulations were generated using the accepted 20% thermal conductivity difference between lightly-doped P− and heavily-doped P++ substrates. The two conditions were modeled with power distributed to a 20 mm×20 mm grid, representing a theoretical die, which was partitioned into 1 mm×1 mm grid squares. For modeling wafers under the uniform heating condition, an operating power of 160 W was uniformly distributed over the 20 mm×20 mm grid. To model wafers with localized hot spots, a localized power increase of 10× (i.e. 1600 W) was concentrated in two detached 1 mm×1 mm grid squares to simulate hot spots while maintaining the same overall die operating power. The modeling was carried out for die thicknesses of 250 μm and 500 μm under both conditions. The results of the thermal modeling are shown below in Tables 1 and 2, corresponding to the uniform heating condition and the localized hot spots condition, respectively. The model also assumed a heat transfer coefficient of 0.84 kW/m$^2$K at the bottom of the substrate, which is based on published values in the literature.

TABLE 1

| Substrate doping | Die Thickness | Maximum T (° C.) |
|---|---|---|
| P++ | 250 μm | 65.0 |
|  | 500 μm | 65.9 |
| P− | 250 μm | 64.8 |
|  | 500 μm | 65.6 |

TABLE 2

| Substrate doping | Die Thickness | Maximum T (° C.) |
|---|---|---|
| P++ | 250 μm | 97.5 |
|  | 500 μm | 90.1 |
| P− | 250 μm | 92.5 |
|  | 500 μm | 85.7 |

The results of the thermal modeling show that under uniform power distribution, both wafers provide similar heat dissipation. Specifically, Table 1 shows that, as compared to the corresponding P++ substrate samples, the maximum die temperature reached in both the P− substrate samples was only 0.2° C. lower for the 250 μm samples and 0.3° C. lower for the 500 μm samples. This small improvement in heat dissipation indicates that the doping concentration of a given wafer's substrate has little impact on heat dissipation under uniform heating.

But in the model for localized hot spots, Table 2 shows that the semiconductor wafer having the P− substrate more effectively dissipated heat from the local hot spots. Specifically, the P− substrate wafer samples resulted in a maximum die temperature approximately 5° C. lower for the 250 μm sample and 4.4° C. lower for the 500 μm sample than the maximum die temperatures of the corresponding P++ substrate wafers.

Figure 5:
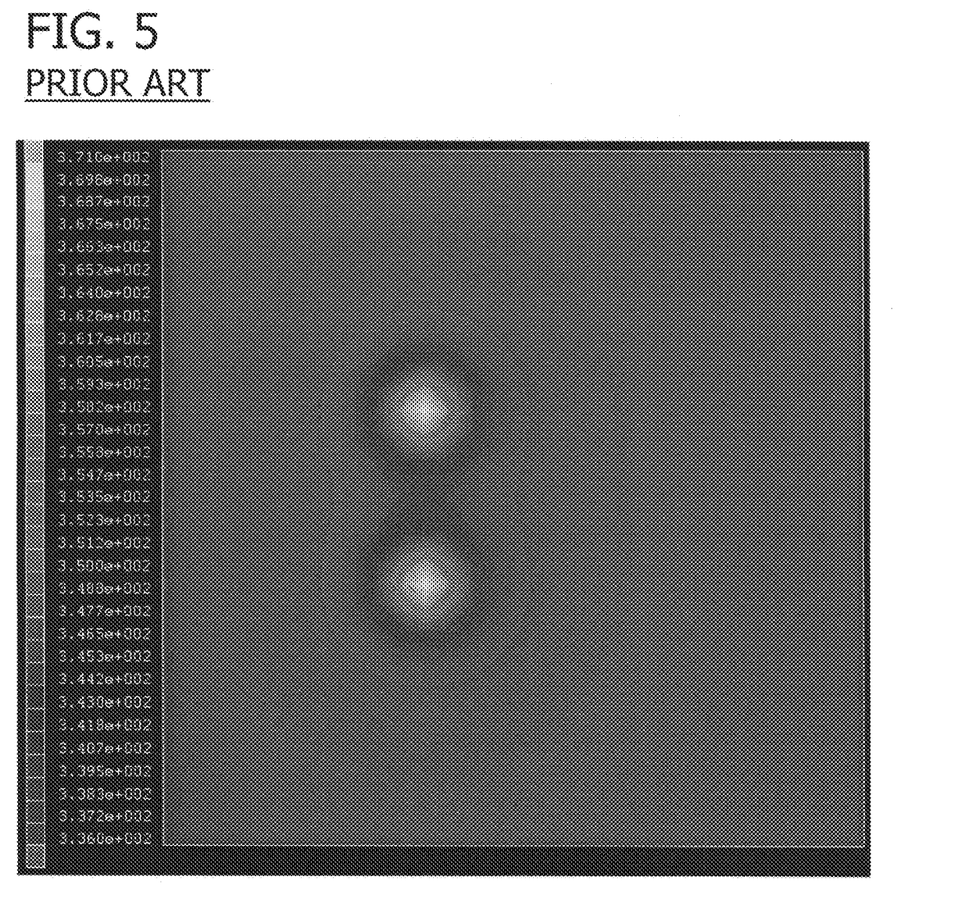
FIG. 5 is a thermal diagram for heat dissipation under localized heating for a 250 µm semiconductor wafer having a highly doped substrate.
Figure 6:
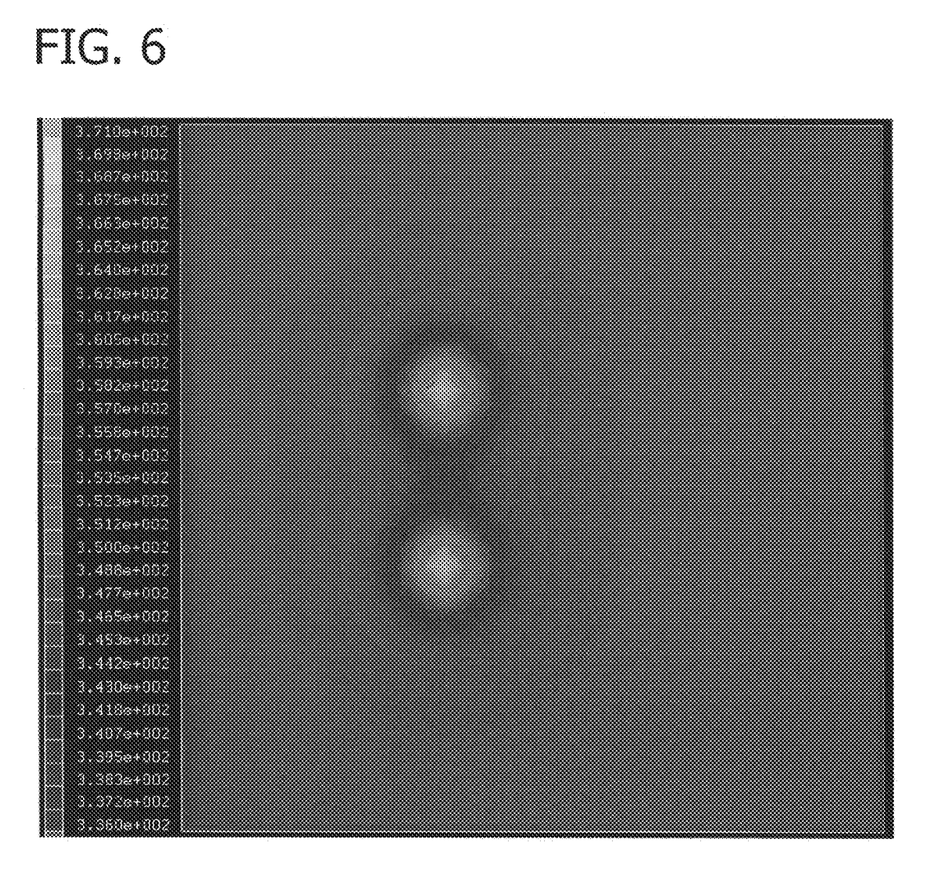
FIG. 6 is a thermal diagram for heat dissipation under localized heating for a 250 µm semiconductor wafer having a highly doped protective layer and a lightly doped substrate.
Figure 7:
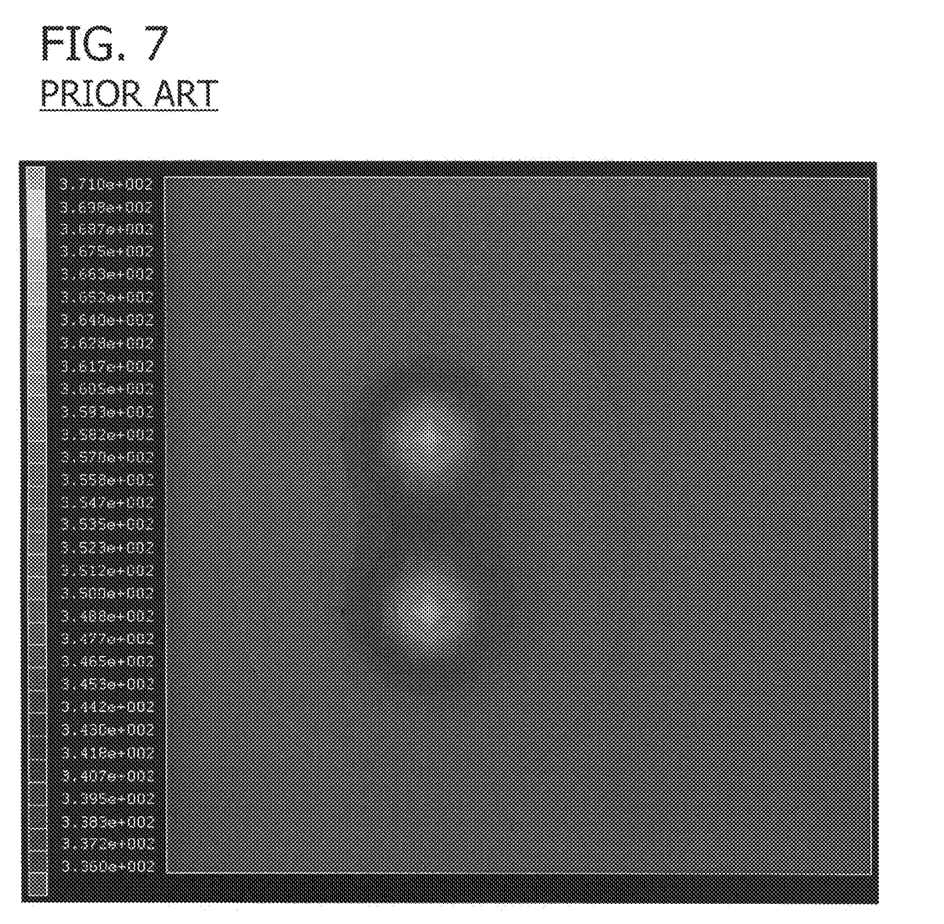
FIG. 7 is a thermal diagram for heat dissipation under localized heating for a 500 µm semiconductor wafer having a highly doped substrate.
Figure 8:
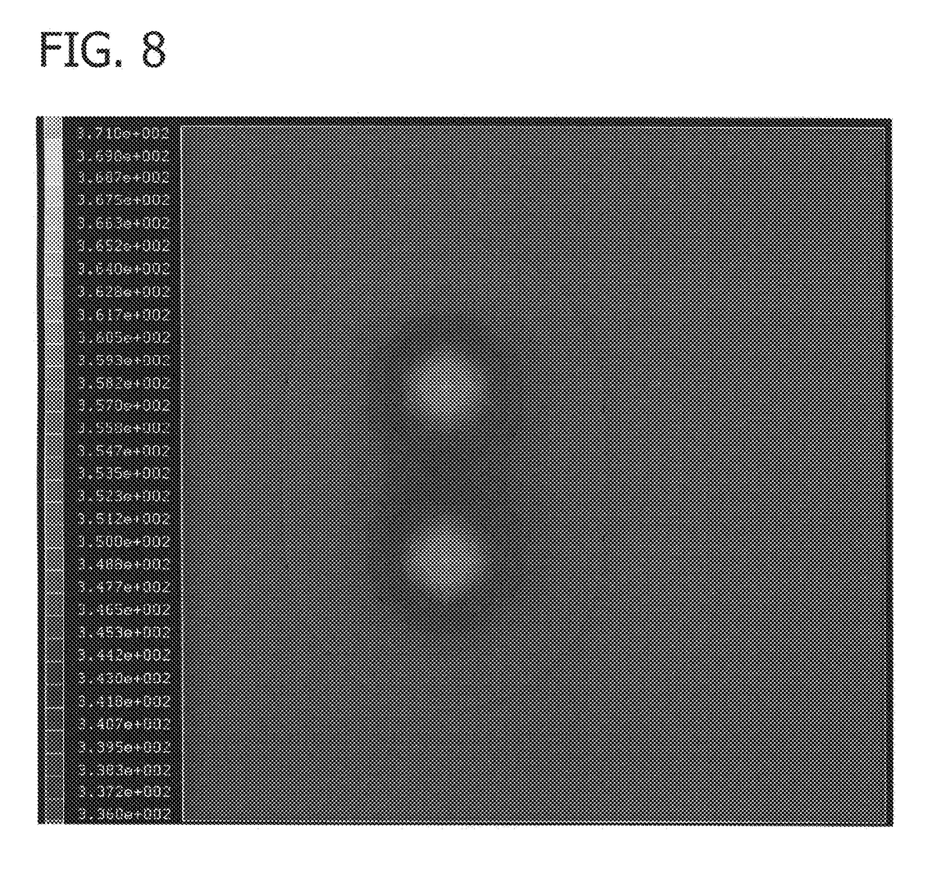
FIG. 8 is a thermal diagram for heat dissipation under localized heating for a 500 µm semiconductor wafer having a highly doped protective layer and a lightly doped substrate.

Temperature contour maps were also created to further demonstrate the difference between the wafers from the hot spot simulation. FIGS. 5 and 6 are directed to wafers with a total thickness of about 250 μm, with FIG. 5 showing the temperature contour map of the wafer having a P++ substrate and FIG. 6 showing the temperature contour map of the wafer having a P− substrate. Similarly, FIGS. 7 and 8 are directed to wafers with a total thickness of about 500 μm, with FIG. 7 showing the temperature contour map of the wafer having a P++ substrate and FIG. 8 showing the temperature contour map of the wafer having a P− substrate. All four of these temperature contour maps show that the temperatures in the 1 mm×1 mm grid square hot spots were less intense in the wafers having a P− substrate than in the wafer having a P++ substrate.

Example 2

In addition to the two semiconductor wafers formed in Example 1, seven more semiconductor wafers were formed having different substrates, as detailed below. Apart from Sample 95 below, all the samples were formed according to the CZ growth method.

For purposes of this Example, the semiconductor wafer formed having a P− substrate from Example 1 is referred to as sample 91, whereas the semiconductor wafer having a P++ substrate is referred to as sample 92.

Further, Sample 93 is a semiconductor wafer consisting essentially of P+ material; i.e., material that is doped at a level between that of the invention's protective layer and substrate, such as about $5 \times 10^{18}$ carriers/cm$^3$.

Sample 94 is a semiconductor wafer consisting essentially of silicon material being doped with both P− and N− doping levels; i.e., the material comprised less than about $1 \times 10^{16}$ P-type carriers/cm$^3$ and less than about $1 \times 10^{16}$ N-type carriers/cm$^3$, such as about $1 \times 10^{15}$ carriers/cm$^3$ of each dopant.

Sample 95 is a semiconductor wafer consisting essentially of silicon material formed according to the float zone method and being doped such that it is P− material, as defined for Sample 94.

Sample 96 is a semiconductor wafer consisting essentially of silicon material being doped such that it is P− material, as defined for Sample 94, and having a low concentration of oxygen interstitials.

Sample 97 is a semiconductor wafer consisting essentially of silicon material being doped such that it is P− material, as defined for Sample 94, and having a high concentration of oxygen interstitials.

Sample 98 is a semiconductor wafer structure having a substrate that is doped such that it is P− material and an epitaxial layer of P− material formed thereon, as P− is defined for Sample 94. The P− epitaxial layer is about 10 μm thick.

Sample 99 is a semiconductor wafer structure having a substrate that is doped such that it is P− material and an epitaxial layer of P− material formed thereon, as P− is defined for Sample 94. The P− epitaxial layer is about 50 μm thick.

Figure 9:
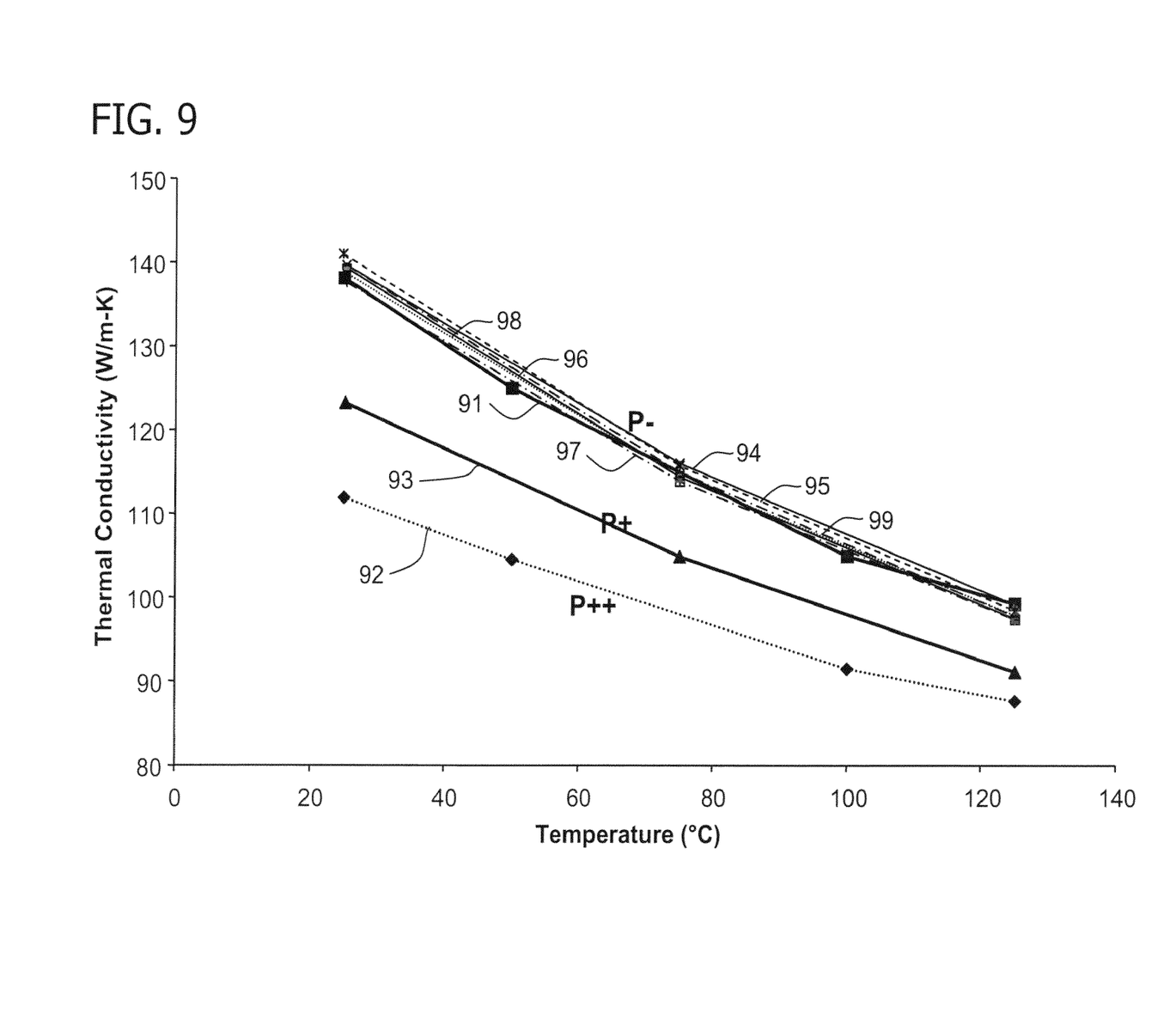
FIG. 9 is a graph showing the thermal conductivity for multiple semiconductor structures as a function of temperature detailed in Example 2.

Samples 91-99 were subjected to thermal conductivity measurements at 25° C., 50° C., 75° C., 100° C., and 125° C. The results are graphically represented in FIG. 9, which shows the lowest thermal conductivity for Sample 92 and the highest thermal conductivity for Samples 91 and 94-99, regardless of temperature. The fact that Samples 91 and 94-99 all displayed substantially similar thermal conductivity profiles indicates that the variables changed between these samples has little impact on their thermal conductivity. Further, Sample 93 displays a thermal conductivity between Sample 92 and the group of Samples 91 and 94-99. This confirms that a silicon structure's doping concentration is the variable with the greatest influence on the thermal conductivity. Moreover, the data shows about a 23% increase in thermal conductivity at about 25° C. from Sample 92 to Samples 91 and 94-99, while an increase of about 13% corresponds to about 125° C. This confirms that the semiconductor structure of the invention, as described herein, displays at least a 5% increase in thermal conductivity at the temperatures between about 25° C. and about 125° C.

When the terms "dopant," "lightly-doped," "heavily-doped," or other terms and phrases referring to dopants are used herein, it is to be understood that either P-type or N-type dopants are being referenced, unless explicitly stated otherwise.

When introducing elements of the present invention or the preferred embodiments(s) thereof, the articles "a", "an", "the" and "said" are intended to mean that there are one or more of the elements. The terms "comprising", "including" and "having" are intended to be inclusive and mean that there may be additional elements other than the listed elements.

In view of the above, it will be seen that the several objects of the invention are achieved and other advantageous results attained.

As various changes could be made in the above products and methods without departing from the scope of the invention, it is intended that all matter contained in the above description and shown in the accompanying drawings shall be interpreted as illustrative and not in a limiting sense.

What is claimed is:

1. A process for the preparation of a semiconductor wafer by use of a substrate having a central axis, a front surface and a back surface that are generally perpendicular to the central axis, a circumferential edge, and a radius extending from the central axis to the circumferential edge, wherein the substrate is doped with a p-type dopant at a concentration between about $5 \times 10^{14}$ carriers/cm$^3$ and about $1 \times 10^{16}$ carriers/cm$^3$, the process comprising:
    forming a protective layer on the front surface of the substrate, the protective layer being doped with a dopant concentration between about $1.0 \times 10^{19}$ carriers/cm$^3$ and about $1.0 \times 10^{20}$ carriers/cm$^3$ and having a thickness of at least about 0.5 μm and less than about 3 μm;
    forming a device layer on the exposed surface of the protective layer parallel to the front surface of the substrate, the device layer being doped with a dopant concentration below about $1 \times 10^{17}$ carriers/cm$^3$ and having a thickness between about 2 μm and about 15 μm; and
    exposing the back surface of the substrate to an alkaline etchant for a time period sufficient to remove substantially all of the substrate, exposing the protective layer.

2. The process of claim 1 wherein the protective layer is formed by exposing the surface of the substrate to an atmosphere comprising silicon and a dopant to deposit a silicon epitaxial layer.

3. The process of claim 1 wherein the protective layer is formed by implanting dopant ions in the surface of the substrate.

4. The process of claim 1 wherein the protective layer is formed by exposing the surface of the substrate to a gas comprising a dopant to form a gas phase-doped layer.

5. The process of claim 1 wherein the protective layer has a thickness between about 1 μm and about 5 μm.

6. The process of claim 1 wherein the protective layer is doped with a dopant concentration between about $8.5 \times 10^{18}$ carriers/cm$^3$ and about $2.0 \times 10^{19}$ carriers/cm$^3$.

7. The process of claim 1 wherein the protective layer is doped with a dopant concentration between about $3.2\times10^{18}$ carriers/cm$^3$ and about $8.5\times10^{18}$ carriers/cm$^3$.

8. The process of claim 6 wherein the substrate has a dopant concentration between about $5\times10^{14}$ carriers/cm$^3$ and about $1\times10^{16}$ carriers/cm$^3$.

9. The process of claim 1 wherein the device layer is doped with a P-type dopant.

10. The process of claim 1 wherein the device layer is doped with boron.

11. The process of claim 1 wherein:

the protective layer is doped with a P-type dopant in a concentration between about $1.0\times10^{19}$ carriers/cm$^3$ and about $2.0\times10^{19}$ carriers/cm$^3$, and has a thickness of at least about 1 μm; and the device layer is doped with a P-type dopant in a concentration between about $1\times10^{14}$ carriers/cm$^3$ and about $4\times10^{16}$ carriers/cm$^3$.

12. The process of claim 1 wherein the etchant comprises a compound selected from the group consisting of potassium hydroxide, sodium hydroxide, tetramethylammonium hydroxide, and combinations thereof.

13. The process of claim 1 wherein the process further comprises exposing the protective layer exposed by the first etch to a second etching step, wherein the protective layer is exposed to an acidic etchant.

14. The process of claim 13 wherein the acidic etchant comprises a solution of hydrofluoric, nitric, and acetic acids.

15. The process of claim 1 wherein the protective layer has a thickness of less than about 2 μm and the device layer is between about 2 μm and about 5 μm thick.

16. The process of claim 1 wherein the thermal conductivity of the substrate is greater than the thermal conductivity of the protective layer.

17. The process of claim 1 wherein the thermal conductivity of the substrate is at least 5% greater than the thermal conductivity of the protective layer.

18. The process of claim 1 wherein the thermal conductivity of the substrate is at least 15% greater than the thermal conductivity of the protective layer.

19. The process of claim 1 wherein the substrate has a thermal conductivity of greater than about 120 W/m·K at room temperature.

20. The process of claim 1 wherein the protective layer has a thermal conductivity of less than about 114 W/m·K at room temperature.

* * * * *